United States Patent
Ohuchi

(10) Patent No.: US 7,232,735 B2
(45) Date of Patent: Jun. 19, 2007

(54) SEMICONDUCTOR DEVICE HAVING A CYLINDRICAL CAPACITOR AND METHOD FOR MANUFACTURING THE SAME USING A TWO-LAYER STRUCTURE AND ETCHING TO PREVENT BLOCKAGE

(75) Inventor: Masahiko Ohuchi, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/289,336

(22) Filed: Nov. 30, 2005

(65) Prior Publication Data

US 2006/0113582 A1    Jun. 1, 2006

(30) Foreign Application Priority Data

Nov. 30, 2004   (JP)   ............................. 2004-346191

(51) Int. Cl.
*H01L 21/20*   (2006.01)

(52) U.S. Cl. .................. 438/396; 438/386; 438/381; 257/301; 257/303; 257/E27.092

(58) Field of Classification Search ................ 438/396, 438/255, 253, 239, 238, 398; 257/309, 306, 257/296, 534, 532, 528

See application file for complete search history.

(56) References Cited

U.S. PATENT DOCUMENTS

| 6,211,010 B1 * | 4/2001 | Lee et al. ................. 438/255 |
| 6,930,015 B2 * | 8/2005 | Ping et al. ................ 438/398 |
| 2005/0070112 A1 * | 3/2005 | Pita et al. ................ 438/700 |
| 2005/0202645 A1 * | 9/2005 | Kim et al. ................ 438/386 |

FOREIGN PATENT DOCUMENTS

| JP | 2000-58790 A | 2/2000 |
| JP | 2000-156476 A | 6/2000 |

* cited by examiner

*Primary Examiner*—James A. Reagan
*Assistant Examiner*—Anthony Ho
(74) *Attorney, Agent, or Firm*—Sughrue Mion, PLLC

(57) ABSTRACT

A semiconductor device according to the present invention includes a cylindrical capacitor. An amorphous silicon layer serving as a lower electrode of the cylindrical capacitor has a two-layer structure including a lower high-concentration impurity sublayer and an upper low-concentration impurity sublayer. The blockage of a cylinder is prevented by etching the upper low-concentration impurity sublayer in a lower region of the cylinder and thereby reducing the crystal grain size of hemispherical silicon grains formed in the lower region.

10 Claims, 14 Drawing Sheets

SEMICONDUCTOR DEVICE HAVING A CYLINDRICAL CAPACITOR AND METHOD FOR MANUFACTURING THE SAME USING A TWO-LAYER STRUCTURE AND ETCHING TO PREVENT BLOCKAGE

This application claims priority to prior application JP 2004-346191, the disclosure of which is incorporated herein by reference.

BACKGROUND OF THE INVENTION

1. Field of the Invention

The present invention relates to a semiconductor device and a method for manufacturing the semiconductor device, and particularly to a semiconductor device having a cylindrical capacitor and a method for manufacturing the semiconductor device.

2. Description of the Related Art

Recent semiconductor devices are becoming large-scale. For example, in a dynamic random access memory (hereinafter referred to as DRAM), a large 1 GB memory is put to practical use. A DRAM memory cell includes one MOS transistor and one capacitor. The capacitor is formed on a diffusion layer of the transistor or in a region across a gate and the diffusion layer and is connected to the diffusion layer.

As semiconductor devices are becoming large-scale, the sizes of elements are reduced year by year. Accordingly, the occupied areas of capacitors are also reduced. Data in the DRAM is determined to be "1" or "0" on the basis of the quantity of electric charges accumulated in the capacitor. Thus, a capacitance more than a certain value is necessary for a stable operation of the memory. The capacitance C of a capacitor is expressed by $C=\epsilon S/d$, where d denotes the distance between two electrodes in the capacitor (thickness of a dielectric film), $\epsilon$ denotes the dielectric constant of the dielectric film, and S denotes the surface area of the electrodes (contact area between the electrodes and the dielectric film). Thus, a reduction in the thickness of the dielectric film in the capacitor, the application of a film having a high dielectric constant, and an increase in the surface area of the electrode are important to secure the capacitance of the capacitor.

In recent years, tantalum oxide ($Ta_2O_5$) and aluminum oxide ($Al_2O_3$) both having a higher dielectric constant than a nitride film ($Si_3N_4$) are used as the film having a high dielectric constant, in place of the nitride film. One of the methods for increasing the surface area of the electrode is to use hemispherical silicon grains (HSGs) to form irregularities on the surface and thereby form a rough surface. This method provides an electrode having a surface area about twice as large as that of a conventional electrode.

A method for forming the HSGs is as follows. First, an amorphous silicon layer serving as a lower electrode of a cylindrical capacitor is seeded by heat treatment in a $SiH_4$ or $Si_2H_6$ atmosphere. Then, the amorphous silicon layer is heat-treated under high vacuum to cause silicon atoms to migrate and thereby grow a crystal grain during crystallization around the seeded Si atom nucleus.

Too many impurities, such as phosphorus (P) atoms, in the amorphous silicon inhibit the migration of silicon and thereby prevent the crystal grain from growing. Hence, the amorphous silicon is generally subjected to an HSG treatment (a treatment that forms HSGs on the surface) in the presence of about 1 to $2 \times 10^{20}$ atom s/$cm^3$ or less of impurities to grow the crystal grain sufficiently. When the impurities, for example, phosphorus (P) atoms are needed because of their shortage, the amorphous silicon layer may be heat-treated again in a $PH_3$ atmosphere to introduce P atoms into the silicon layer after the HSG treatment.

As elements are reduced in size, the cylindrical capacitor must also be reduced in size. Several techniques have been disclosed to reduce the size of the cylindrical capacitor. Japanese Unexamined Patent Application Publication No. 2000-058790 discloses a technique to achieve sufficient electrical separation between adjacent cells. In this technique, ions are implanted into an amorphous silicon film to prevent HSGs from growing on the top surface of an insulating film serving as a separator between adjacent capacitors.

Japanese Unexamined Patent Application Publication No. 2000-156476 discloses a technique to grow uniform crystal grains over the entire surface of a capacitor electrode and achieve sufficient electrical conductivity. In this technique, amorphous silicon grains are formed and are subjected to an HSG treatment. Then, polycrystalline silicon is laminated on the silicon grains.

However, new problems have arisen in a cylinder hole having a higher aspect ratio in a smaller cylindrical capacitor. An etched cylinder hole having a higher aspect ratio has different opening areas at the top surface, a bowing portion, and the bottom. Specifically, the bottom of the cylinder hole has a smaller opening area. FIGS. 1A and 1B shows this situation.

As illustrated in FIG. 1A, a mask insulating film 33 and an interlayer insulating film 34 are formed on an interlayer insulating film 31 provided with a contact plug 32. Then, a capacitor hole (cylinder hole) 35 is bored to form a cylindrical capacitor. The capacitor hole 35 has an opening area defined by lithography on the uppermost surface of the interlayer insulating film 34 (hereinafter referred to as top surface), as indicated by Da in FIG. 1a. A bowing portion at a slightly lower position from the top surface has an opening area larger than that defined by the lithography, as indicated by Db. Furthermore, the opening area of the hole gradually decreases in a region lower than the bowing portion. The bottom of the hole has the minimum opening area, as indicated by Dc.

In particular, in a recent large-scale integration semiconductor device having an aspect ratio of at least 10, an etching gas flowing into the capacitor hole 35 enhances the etching of the bowing portion and thereby increases the opening area at the bowing portion. However, the concentration of the etching gas decreases with increase in the depth from the top surface. Thus, the lower portion may be etched insufficiently. As a result, the opening area of the hole decreases with increase in the depth from the top surface. The bottom of the hole has the minimum opening area. The decrease in etching rate at the bottom of the hole is known as a microloading effect. The smaller opening area at the lower region of the capacitor hole causes new problems as follows.

As illustrated in FIG. 1B, silicon is grown in the capacitor hole 35 to form a lower electrode of the capacitor and is subjected to the HSG treatment to form HSGs 36. Then, the top surface of the interlayer insulating film 34 and the HSGs 36 are covered with a capacitive dielectric film 37. Since the opening area is small in the lower region of the capacitor hole 35, the HSGs in opposite regions on the sidewall of the hole may come into contact with each other and thereby block the cylinder. Thus, a capacitor is not formed in a region lower than the blocked portion. This extremely decreases the capacitance and may cause malfunction of a semiconductor device.

Furthermore, when the HSGs formed in opposite regions on the sidewall of the hole come close to each other, a reactant gas may be supplied insufficiently. This prevents the formation of the capacitive dielectric film 37 in the regions and causes variations in the thickness of the capacitive dielectric film 37. In a region where the capacitive dielectric film 37 has a decreased thickness, accumulated charges may leak from the capacitor because of an increased leakage current or a short. This may hamper the operation of a memory and cause malfunction of a semiconductor device.

The present assignee deliberated these issues and proposed a manufacturing method described in Japanese Patent Application No. 2004-186805. According to this proposal, the blockage of a cylinder is prevented by increasing the concentration of impurities in amorphous silicon at the bottom and in a lower region of a capacitor hole by ion implantation or a diffusion method and thereby decreasing the crystal grain size of HSGs on the bottom and in the lower region of the hole.

SUMMARY OF THE INVENTION

The present invention solves the problems described above by a method simpler than the proposal described above.

The present invention is to provide a semiconductor device including a reliable cylindrical capacitor having a large capacitance and a method for manufacturing the semiconductor device. This is achieved by preventing the blockage of a cylinder hole in the cylindrical capacitor and thus forming a capacitive dielectric film without variations in thickness.

According to the present invention, a method for manufacturing a semiconductor device including a cylindrical capacitor is provided.

The method according to an aspect of the present invention comprises the steps of boring a capacitor hole for the cylindrical capacitor and forming a silicon layer including a lower high-concentration impurity sublayer and an upper low-concentration impurity sublayer on the wall of the capacitor hole. The lower high-concentration impurity sublayer contains a high concentration of impurities and the upper low-concentration impurity sublayer contains a low concentration of impurities. The method further comprises the steps of etching the silicon layer by anisotropic etching and roughening the surface of the silicon layer with a hemispherical silicon grain treatment after etching.

It is preferable that the thickness of a residual silicon layer on the bottom of the capacitor hole in the etching step is controlled by monitoring a change in plasma emission generated by the etching of the silicon layer on the top surface of the capacitor hole to determine an etching end point.

It is preferable that the etching rate of silicon on the top surface of the capacitor hole is higher than the etching rate of silicon on the bottom of the capacitor hole in the etching step.

It is preferable that the upper low-concentration impurity sublayer on the bottom of the capacitor hole is completely etched away and the upper low-concentration impurity sublayer in a lower region of the capacitor hole is partly etched away in the etching step.

It is preferable that the hemispherical silicon grains on the bottom of the capacitor hole are smaller in crystal grain size than those in an upper region of the capacitor hole in the roughening step.

According to the present invention, a semiconductor device including a cylindrical capacitor formed in an insulating film is also provided.

In the semiconductor device according to an aspect of the present invention, the bottom of a cylinder for the cylindrical capacitor has an opening area smaller than that of the top surface of the cylinder. The cylinder has hemispherical silicon grains on the wall. The hemispherical silicon grains on the bottom of the cylinder are smaller in crystal grain size than those in an upper region of the cylinder.

It is preferable that the cylinder has a lower region of an inclined sidewall between the upper region and the bottom, and the hemispherical silicon grains formed in the lower region are smaller in crystal grain size than the hemispherical silicon grains formed in the upper region and are larger in crystal grain size than the hemispherical silicon grains formed on the bottom.

It is preferable that a silicon foundation layer is formed on the wall of the cylinder, and the thickness of the silicon foundation layer on the bottom of the cylinder is smaller than that in the upper region of the cylinder.

It is preferable that the insulating film comprises a silicon oxide system insulating film made of a material selected from the group of silicon oxide, a boron phosphorous silicate glass, a phosphorous silicate glass, a non-doped silicate glass, a boron silicate glass, a spin-on glass, and silicon oxide nitride and a nitride film.

It is preferable that semiconductor device comprises the cylindrical capacitor as a memory cell.

It is preferable that the semiconductor device is a dynamic random access memory.

DESCRIPTION OF THE PREFERRED EMBODIMENTS

A semiconductor device according to the present invention and a method for manufacturing the semiconductor device will be described below with reference to the attached drawings.

[First Embodiment]

Figure 14:
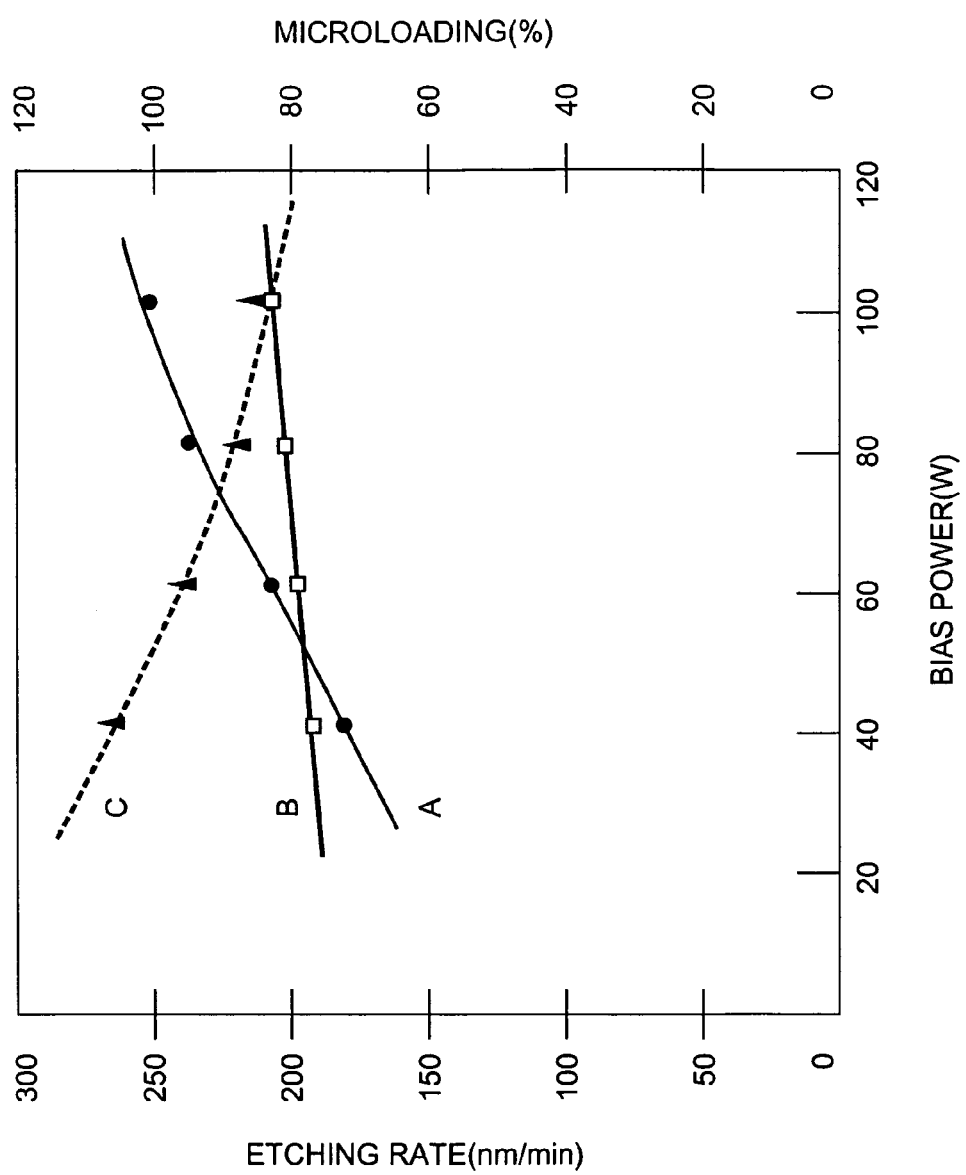
FIG. 14 is a graph illustrating a correlation between a bias power and the etching rate of silicon and between the bias power and the microloading effect according to the present invention.

A first embodiment will be described below with reference to FIGS. 2 to 11 and 14. FIGS. 2 to 11 are cross-sectional views illustrating main manufacturing steps of a semiconductor device according to a first embodiment. FIG. 14 illustrates a correlation between a bias power and the etching rate of silicon and between the bias power and the microloading effect in the etching of amorphous silicon. In the present embodiment, although a cylindrical capacitor is applied to a memory cell for a DRAM in the present embodiment, the present embodiment can also be applied to form a capacitor for use in another semiconductor device.

Figure 1A:
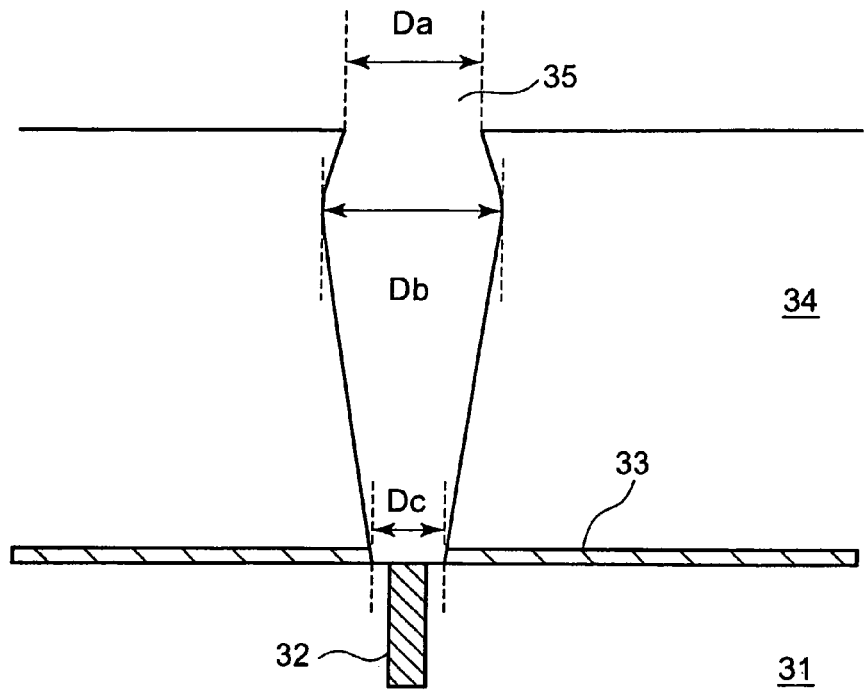
FIG. 1A is a cross-sectional view of a conventional cylindrical capacitor after silicon etching.
Figure 1B:
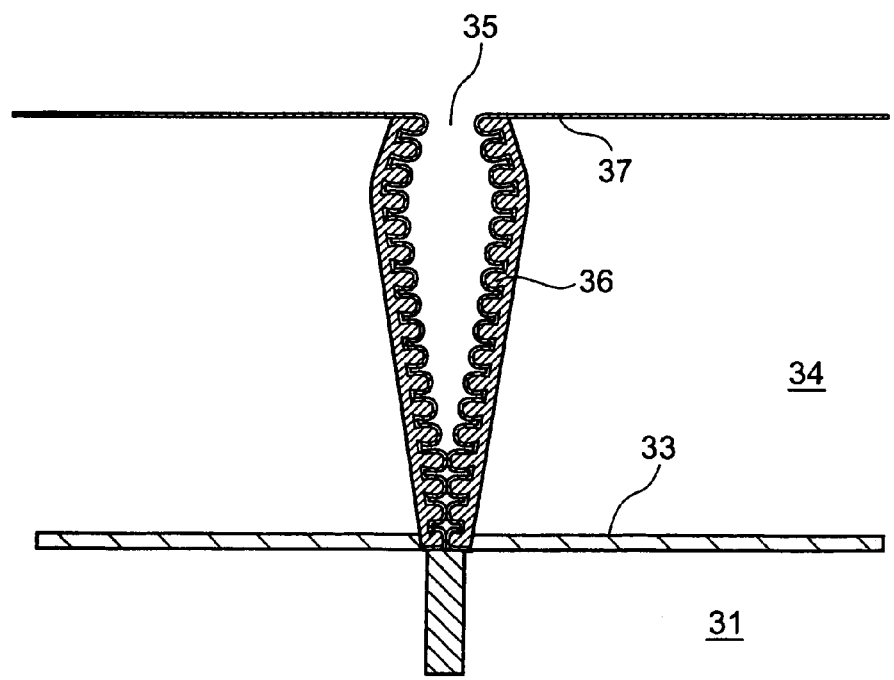
FIG. 1B is a cross-sectional view of a conventional cylindrical capacitor after a capacitive dielectric film is formed.
Figure 2:
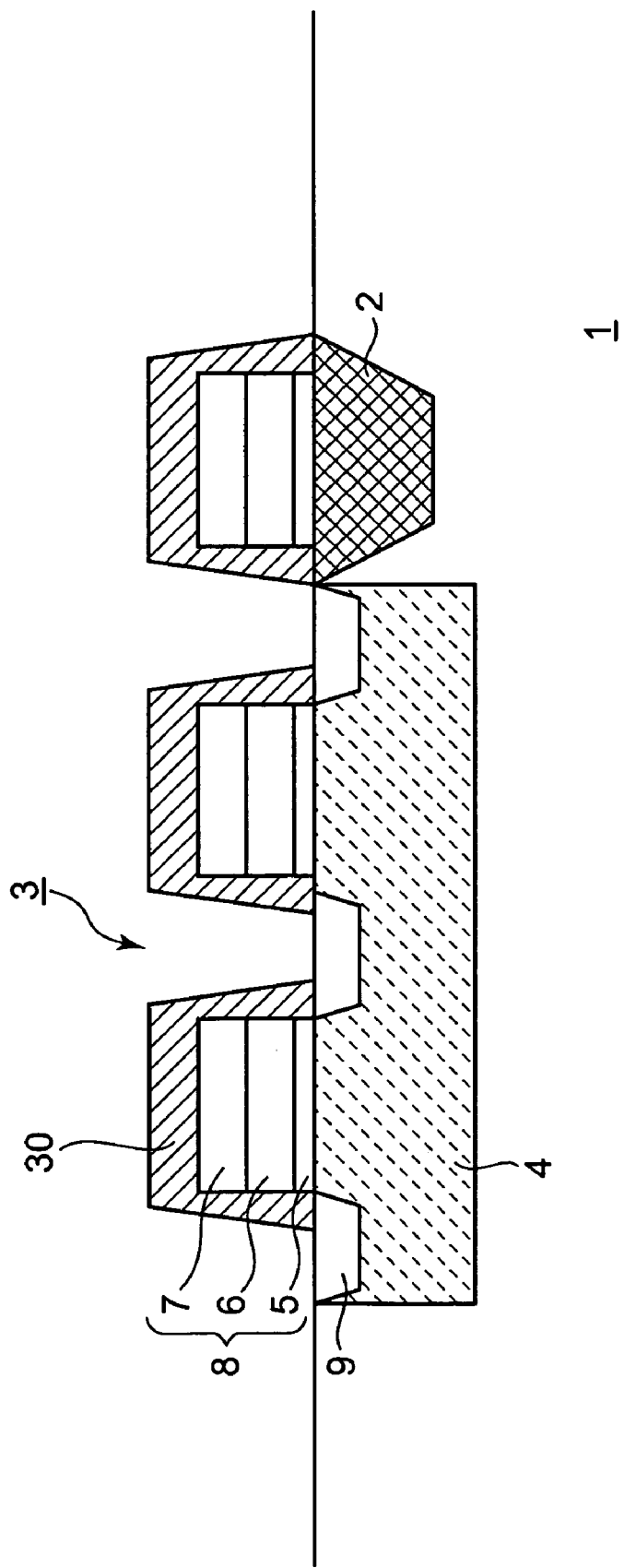
FIG. 2 is a cross-sectional view illustrating a method for manufacturing a semiconductor device according to a first embodiment of the present invention.

As illustrated in FIG. 2, a device isolation region 2 is formed in a silicon semiconductor substrate 1 and then a memory cell transistor 3 is formed. The memory cell transistor 3 includes a gate insulating film 5 on a p-well region 4, gate electrodes 8 each containing a polycrystalline silicon film 6 and a silicide film 7 stacked on the gate insulating film 5 on the p-well region surface 4, and source/drain regions 9 matched to the gate electrodes 8. Part of the gate electrodes 8 can also be used as a lead in a device isolation region. Each gate electrode 8 is covered with an insulating film 30.

Figure 3:
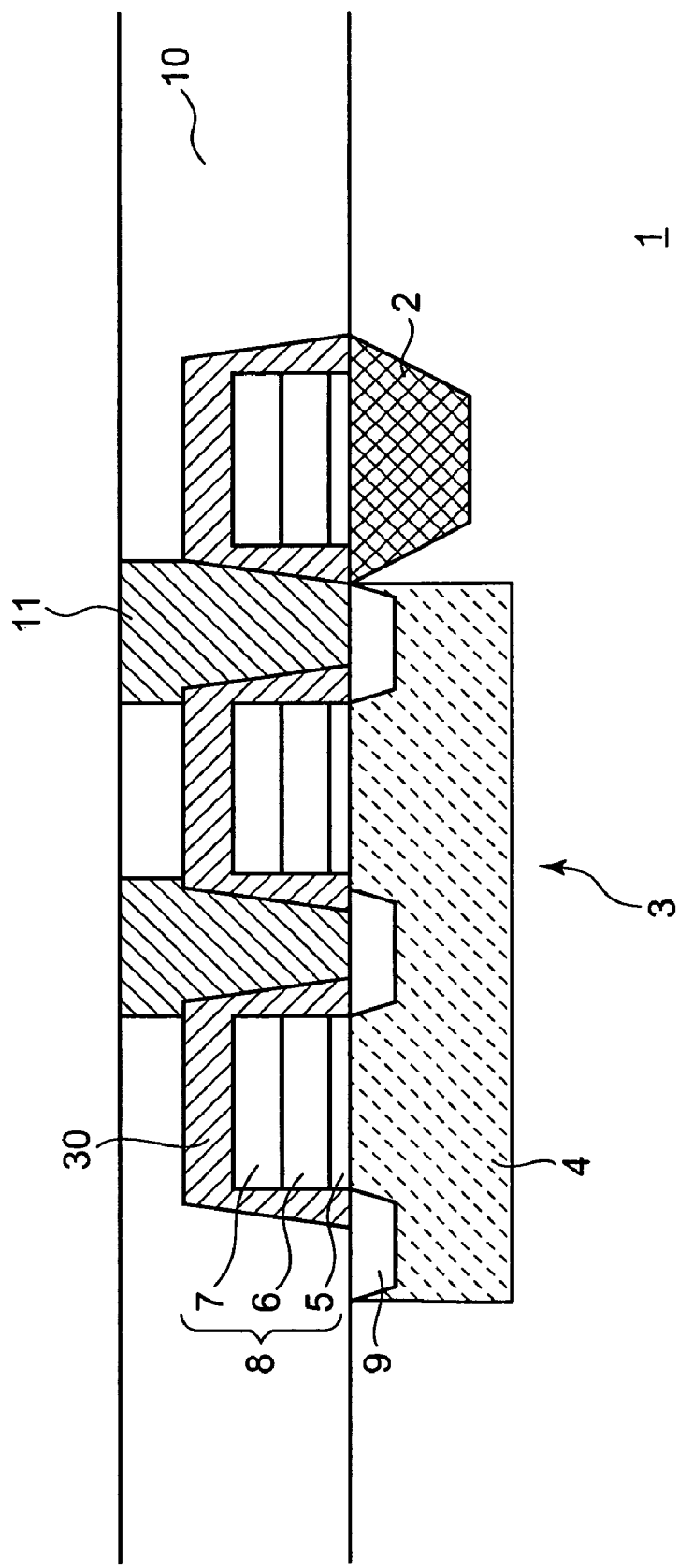
FIG. 3 is a cross-sectional view illustrating the method for manufacturing the semiconductor device according to the first embodiment of the present invention, continued from FIG. 2.

In FIG. 3, the memory cell transistor 3 is covered with a first interlayer insulating film 10. A contact hole reaching one of the source/drain regions 9 is bored in the first interlayer insulating film 10 by lithography and anisotropic dry etching. Then, polysilicon or amorphous silicon is deposited in the contact hole and is etched back or is subjected to chemical-mechanical polishing (CMP) to form a polysilicon plug 11.

Figure 4:
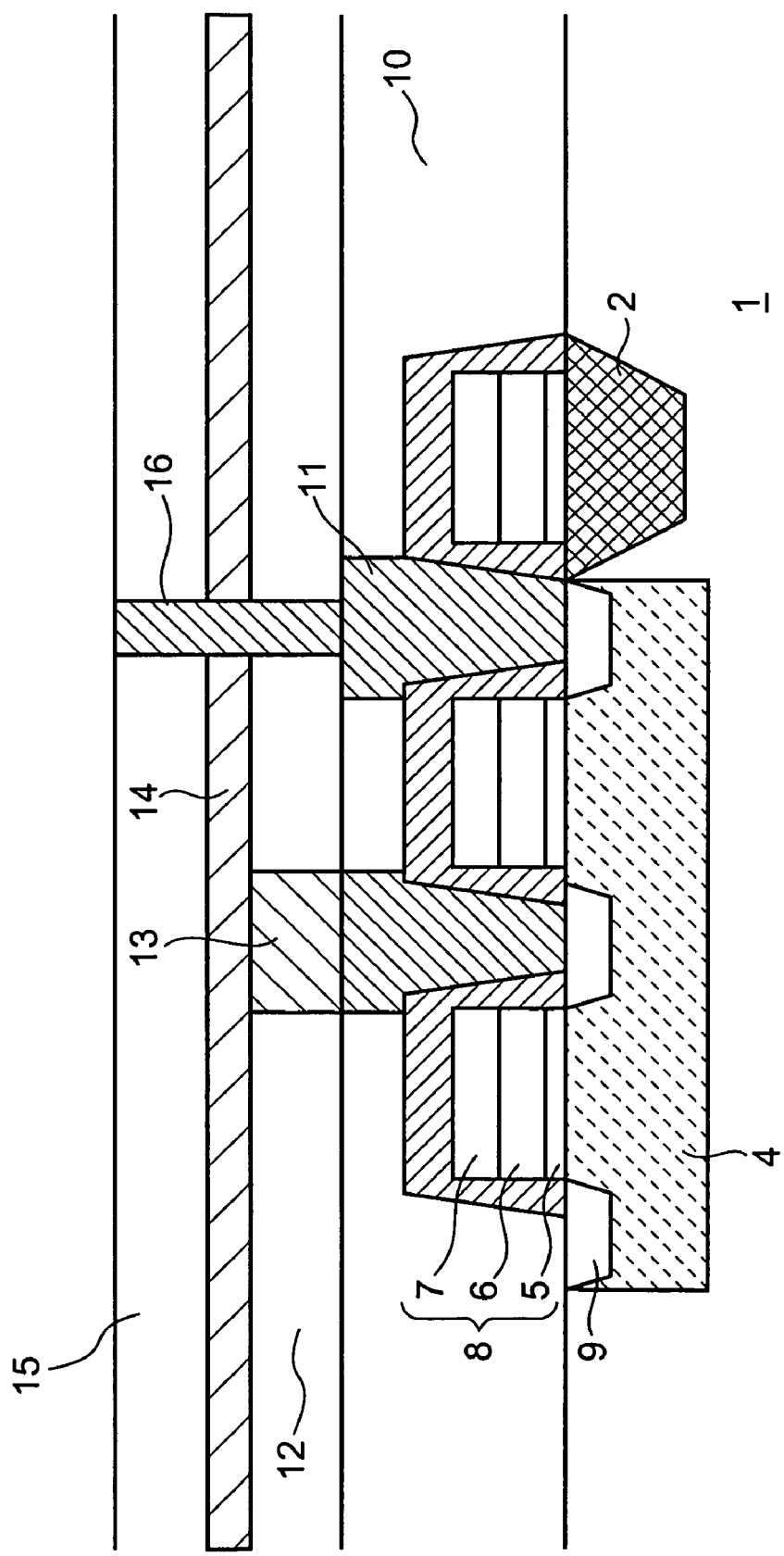
FIG. 4 is a cross-sectional view illustrating the manufacturing method, continued from FIG. 3.

In FIG. 4, a second interlayer insulating film 12 is formed on the first interlayer insulating film 10 after the polysilicon plug 11 is formed. A hole is bored at a predetermined position in the second interlayer insulating film 12 by lithography and anisotropic dry etching. Then, TiN and W are deposited in the hole and are etched back or are subjected to CMP to form a tungsten (W) plug 13. After the W plug 13 is formed, TiN and W are further deposited on the second interlayer insulating film 12, and are formed into a bit line 14 by lithography and anisotropic dry etching.

A third interlayer insulating film 15 is formed over the second interlayer insulating film 12 to cover the bit line 14. A hole reaching the polysilicon plug 11 connected to one of the source/drain regions 9 is bored in the second and the third interlayer insulating film 12 and 15 by lithography and anisotropic dry etching. Then, polysilicon or amorphous silicon is deposited in the hole and is etched back or is subjected to CMP to form a polysilicon plug 16.

Figure 5:
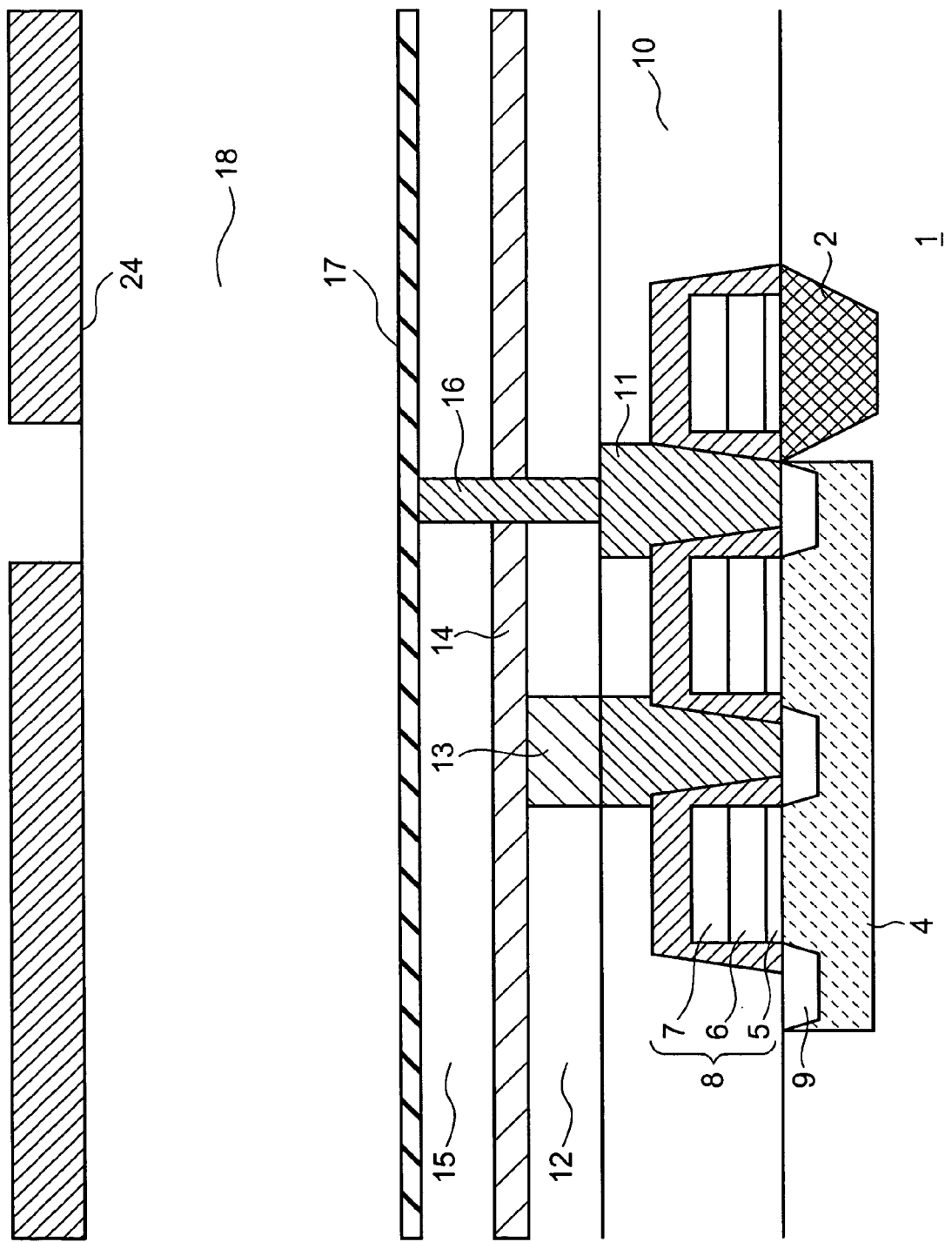
FIG. 5 is a cross-sectional view illustrating the manufacturing method, continued from FIG. 4.

As illustrated in FIG. 5, a nitride film 17 for an etching stopper and an insulating film ($SiO_2$) 18 are deposited on the third interlayer insulating film 15 as a fourth interlayer insulating film having a thickness of 2 to 3 µm. A capacitor hole is patterned on the insulating film ($SiO_2$) 18 by lithography. As an etching mask 24, in addition to a resist, a film made of a hard mask material (α-C or Si) may be formed on the insulating film 18. Then, etching may be performed using the resist and the film as a hard mask. While the insulating film 18 is an oxide film (silicon oxide) in the present embodiment, it may be an silicon oxide system insulating film made of a silicon oxide-based material, such as a boron phosphorous silicate glass (BPSG), a phosphorous silicate glass (PSG), a non-doped silicate glass (NSG), a boron silicate glass (BSG), a spin-on glass (SOG), or silicon oxide nitride (SION).

Figure 6:
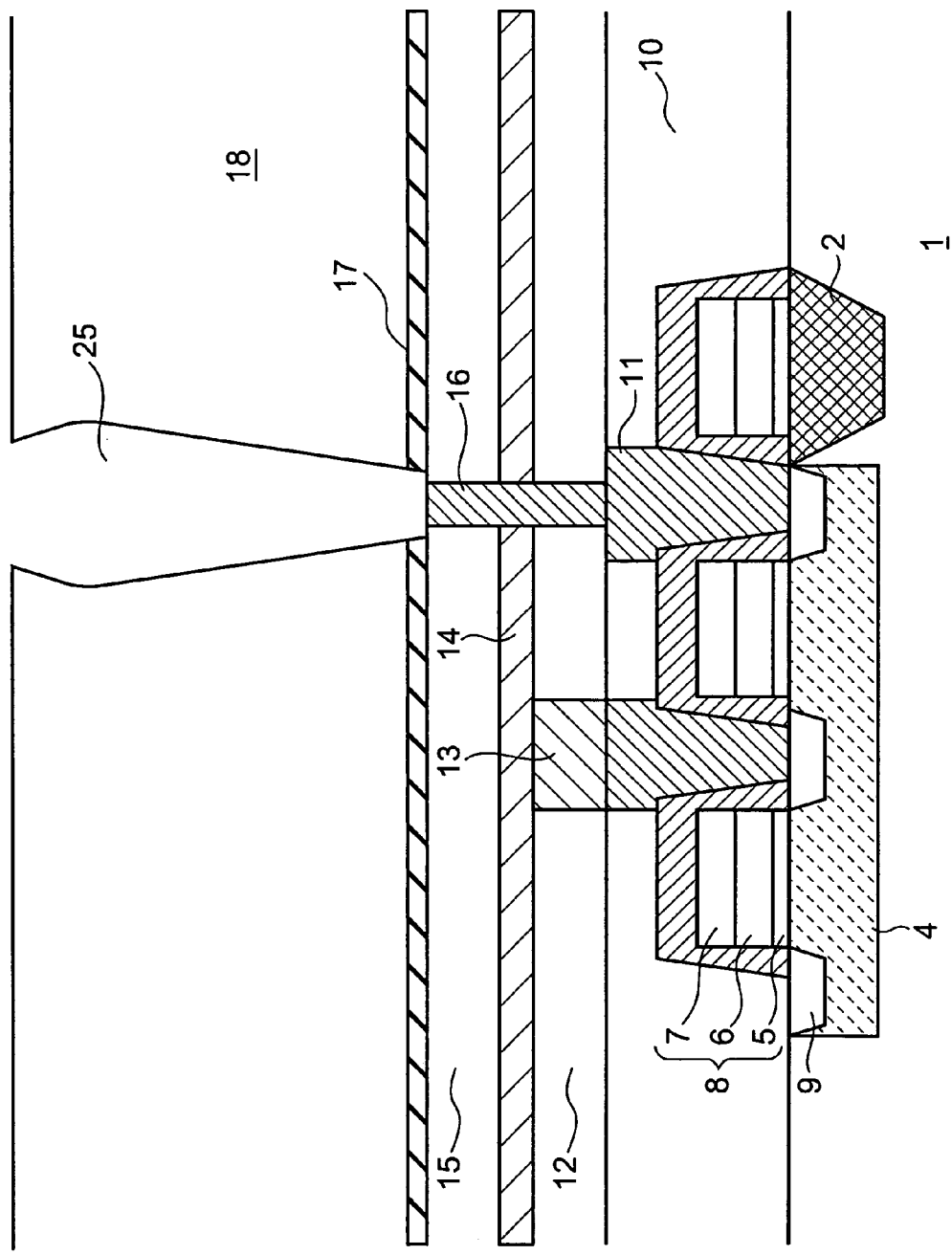
FIG. 6 is a cross-sectional view illustrating the manufacturing method, continued from FIG. 5.

As illustrated in FIG. 6, a cylindrical capacitor hole 25 is bored by anisotropic dry etching of the insulating film 18 and the nitride film 17. The capacitor hole 25 has an opening area defined by lithography on the top surface. As described before, the capacitor hole 25 has a bowing portion having an opening area larger than that defined by the lithography at a slightly lower position from the top surface. The capacitor hole 25 is tapered down from the bowing portion to the bottom. The top surface refers to the uppermost surface of the insulating film 18 and the hole on the uppermost surface. A region around the bowing portion, that is, a region having an opening area equal to or larger than that on the top surface is hereinafter referred to as an upper region. Another region having an opening area smaller than that on the top surface is hereinafter referred to as a lower region.

Figure 7:
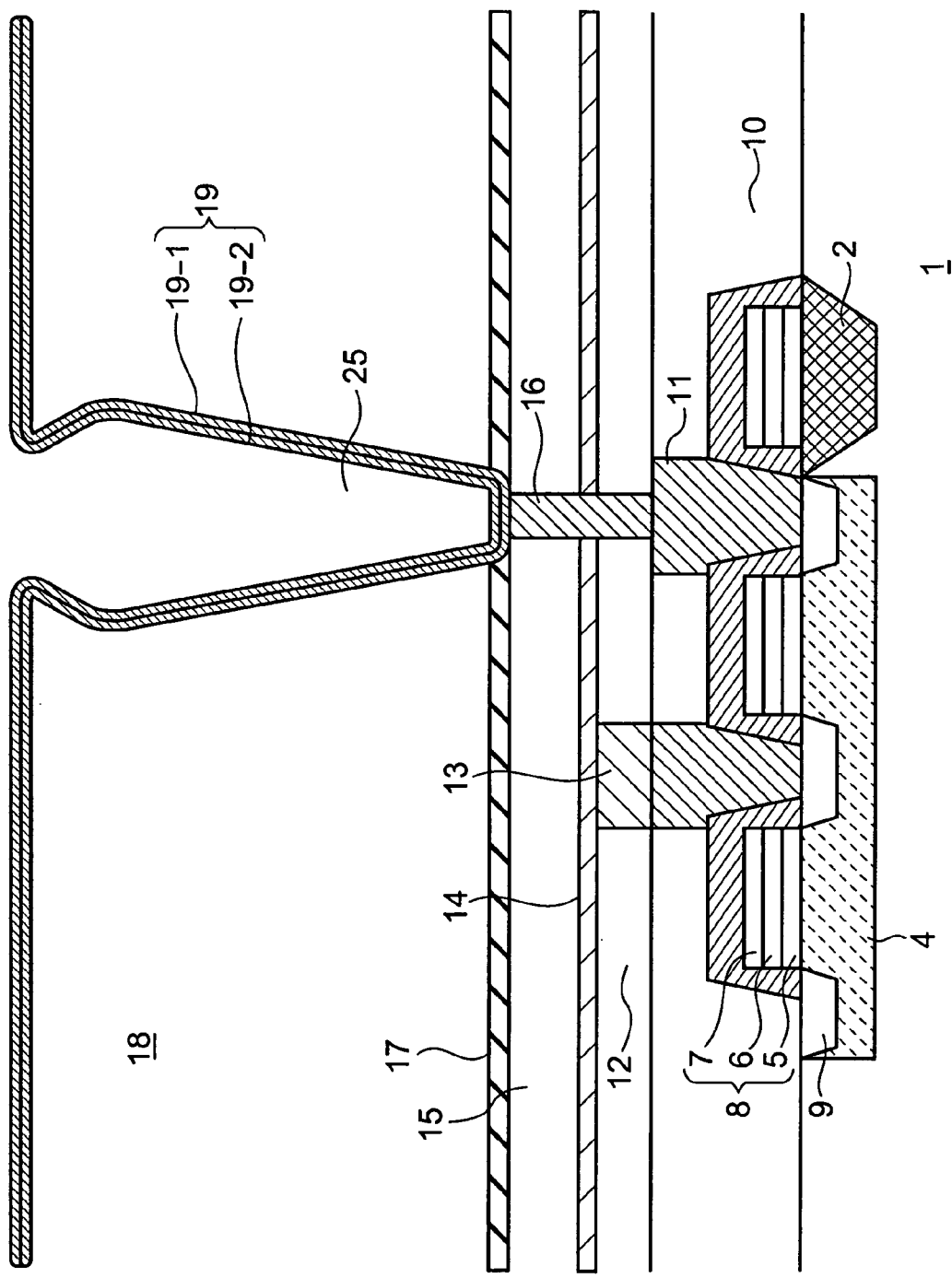
FIG. 7 is a cross-sectional view illustrating the manufacturing method, continued from FIG. 6.

As illustrated in FIG. 7, an amorphous silicon layer 19 having a thickness of 40 nm is deposited on the insulating film 18 and on the bottom of the capacitor hole 25. The amorphous silicon layer 19 has a two-layer structure in the present embodiment. A lower silicon sublayer 19-1 is a high-concentration impurity sublayer containing $1 \times 10^{20}$ to $4 \times 10^{20}$ atoms/cm$^3$ of phosphorus (P) and having a thickness of 15 nm. An upper silicon sublayer 19-2 is not doped and has a thickness of 25 nm. Although the upper silicon sublayer 19-2 is made of a non-doped silicon, phosphorus in the lower high-concentration impurity sublayer slightly diffuses into the upper silicon sublayer 19-2 owing to heat during film formation. Thus, the upper silicon sublayer 19-2 is hereinafter referred to as a low-concentration impurity sublayer (upper low-concentration impurity sublayer). The amorphous silicon layer 19 forms a lower electrode of the cylindrical capacitor. While the amorphous silicon layer 19 has a two-layer structure in the present embodiment, it may have three or more silicon sublayers.

An exemplary condition for forming the amorphous silicon layer 19 is, for example, as follows: temperature=530° C., pressure=100 Pa, the flow rate of a silane ($SiH_4$) gas=2000 sccm, and the flow rate of a 1% phosphine ($PH_3$) gas=60 sccm. Under this condition, the resulting silicon layer contains $2 \times 10^{20}$ atoms/cm$^3$ of impurities. Without the phosphine ($PH_3$) gas, the resulting silicon layer is a non-doped silicon layer. The 1% phosphine ($PH_3$) gas used herein means a mixed gas of He (99%) and $PH_3$ (1%).

Figure 8:
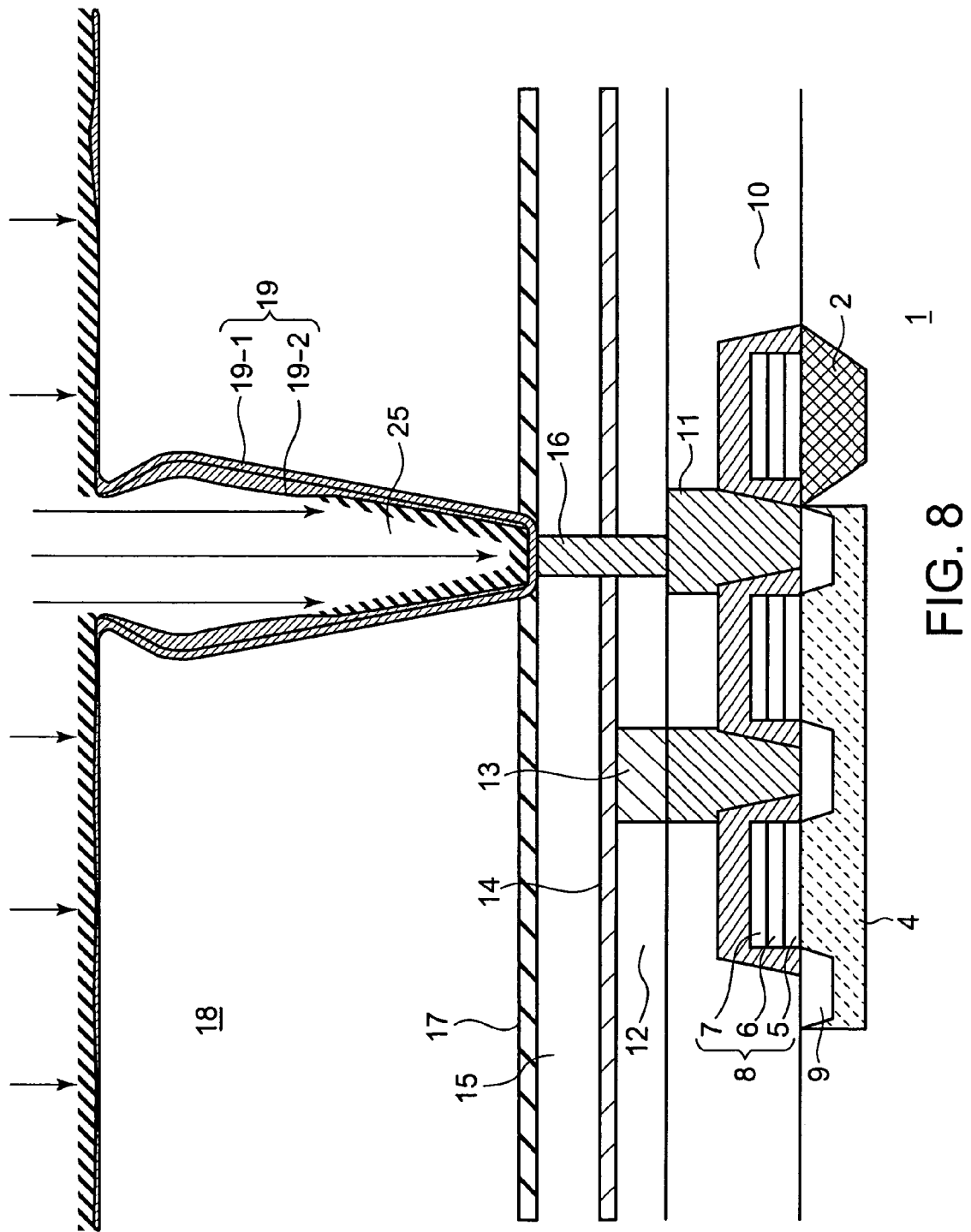
FIG. 8 is a cross-sectional view illustrating the manufacturing method, continued from FIG. 7.

Then, as illustrated in FIG. 8, the amorphous silicon layer 19 is etched by anisotropic dry etching. The anisotropic etching etches silicon on the top surface, in the lower region of the hole, and on the bottom of the hole, indicated by oblique lines in FIG. 8. The anisotropic etching is performed under the conditions that have a large microloading effect. The etching rate is greater in the following order: silicon on the top surface>silicon on the bottom of the hole>silicon on the sidewall of the hole. An etching end point is set to be just-etch or under-etch, which is right before the just-etch, of the silicon on the top surface.

The etching end point is determined between the minimum time required for etching the low-concentration impurity sublayer on the top surface and the maximum time required for etching the high-concentration impurity sublayer on the bottom. A residual low-concentration impurity sublayer increases the particle size of an HSG. On the other hand, complete etching of the high-concentration impurity sublayer on the bottom results in disconnection from the contact plug 16. Thus, etching is performed so as to leave at least part of the high-concentration impurity sublayer on the bottom. The end point can be determined by monitoring a change in plasma emission. For example, when silicon on the top surface is almost removed, a rapid decrease in the amount of silicon to be etched causes a change in the plasma state. A change in the plasma state can also be monitored at the boundary between the low-concentration impurity sublayer and the high-concentration impurity sublayer. In this way, the etching end point can be determined based on the plasma state.

When etching is completed, silicon on the top surface is mostly etched away and thus the remaining is only part of the lower high-concentration impurity sublayer. Silicon in the upper region of the cylinder (hole) is not etched and remains completely. In the lower region of the cylinder, the upper low-concentration impurity sublayer is partly etched away to have a reduced thickness. On the bottom of the hole, the upper low-concentration impurity sublayer is etched away and the lower high-concentration impurity sublayer is partly etched away while the remaining lower high-concentration impurity sublayer has a thickness necessary to an electrode of the capacitor.

FIG. 14 illustrates a correlation between a bias power and the etching rate of silicon and between the bias power and the microloading effect, as an example of silicon etching condition. Line A represents the etching rate of silicon on the top surface. Line B represents the etching rate of silicon on the bottom of the hole. Line C represents the microloading effect as indicated by the ratio of the etching rate at the bottom of the hole to the etching rate at the top surface (B/A). Etching was performed using induction coupled plasma (ICP) at $Cl_2$=240 sccm, $O_2$=3 sccm, HBr=30 sccm, a source power=600 W, a cathode temperature=20° C., and a pressure=0.6 Pa. The source power is applied to a source coil. The bias power is applied to a lower electrode supporting a wafer.

The etching rate of silicon at the top surface depends largely on the bias power and increases with the bias power. On the other hand, the etching rate of silicon at the bottom of the hole also depends but weakly on the bias power. Accordingly, the microloading effect increases with the bias power. That is, the difference in etching level between the top surface and the bottom of the hole increases with the bias power. In the present invention, etching is preferably performed at a bias power of at least 60 W, at which the microloading effect is expected. Inversely, when the etching rate ratio (B/A) is 1.0 or more, it is called an inverse microloading effect. In general, the inverse microloading effect rarely occurs. Thus, the capacitor hole is bored under etching conditions where the microloading effect occurs.

Figure 9:
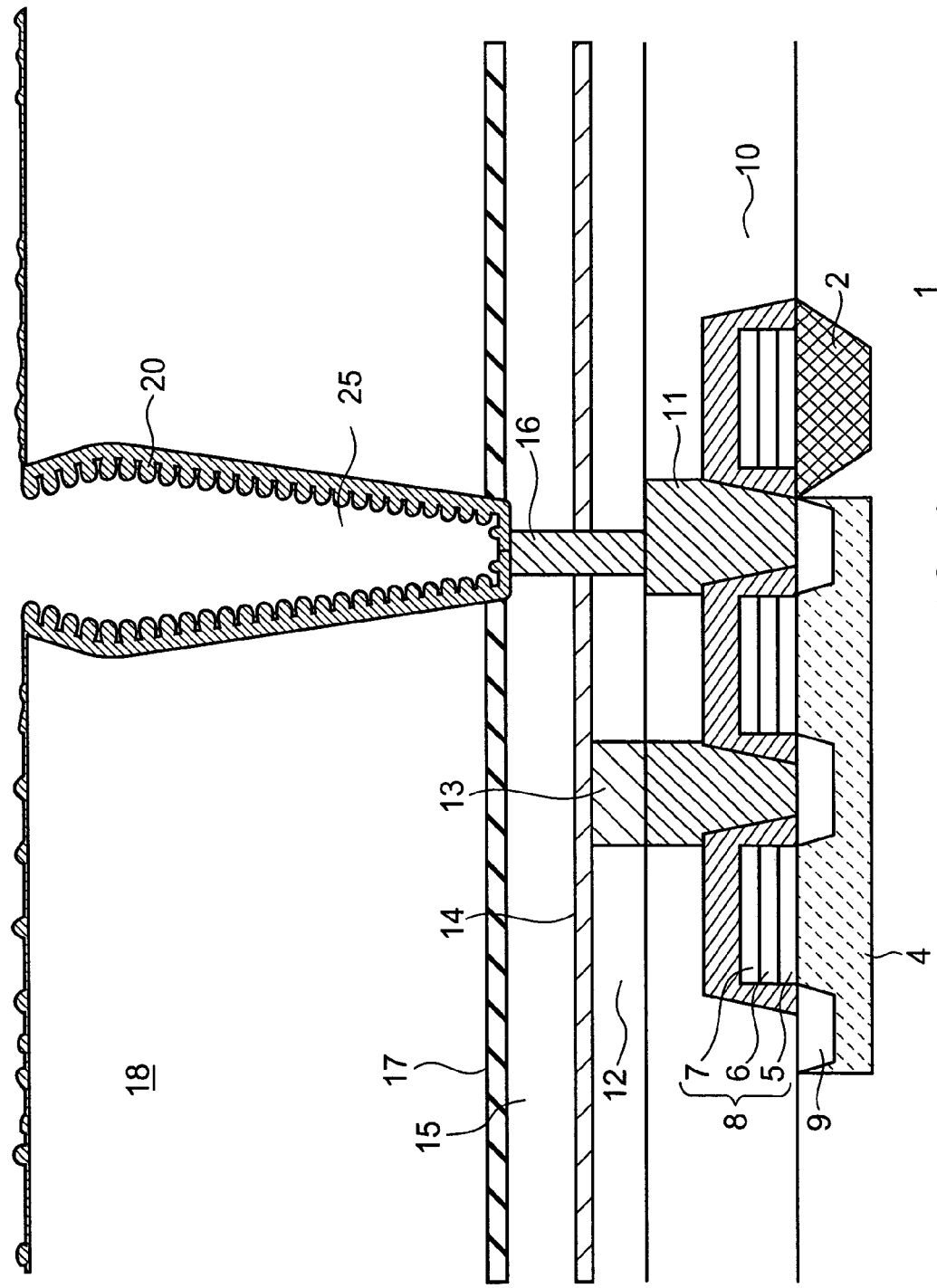
FIG. 9 is a cross-sectional view illustrating the manufacturing method, continued from FIG. 8.

Then, as illustrated in FIG. 9, HSGs 20 are formed within the capacitor hole 25 by an HSG treatment. In the HSG treatment, the amorphous silicon layer 19 is washed to remove a natural oxidation film. Then, an HSG apparatus is used to treat the amorphous silicon layer 19, for example, at a temperature of 560° C. and a pressure of $1\times10^{-6}$ Pa for ten minutes using silane ($SiH_4$) as a seeding gas. Microcrystal grains are formed on the lower electrode of the capacitor. Then, the amorphous silicon layer 19 is heat-treated at a temperature of 560° C. and a pressure of $1\times10^{-8}$ Pa for 20 minutes to form the HSGs 20.

Since the amorphous silicon layer 19 is mostly etched away from the top surface, no HSG is formed on the top surface. Since the low-concentration impurity sublayer is not etched in the upper region of the hole, the resulting HSGs have a large crystal grain size. Since the upper low-concentration impurity sublayer in the lower region of the hole is partly etched away to have a reduced thickness, the resulting HSGs have a slightly large crystal grain size. Since only the lower high-concentration impurity sublayer remains on the bottom of the hole, the resulting HSGs have a small crystal grain size.

In this process, a silicon layer that is not used in the formation of HSGs and remains on the sidewall of the hole to connect HSGs together serves as a base of the lower electrode of the capacitor. Such a silicon layer is referred to as a silicon foundation layer low-concentration impurity hereinafter. The thickness of the silicon foundation layer is smallest on the bottom of the hole, is intermediate in the lower region of the hole, and is largest in the upper region of the hole.

As described above, the crystal grain size of HSG changes in a manner that depends on the vertical position in the hole (cylinder): the grain size in the upper region of the hole>the grain size in the lower region of the hole>the grain size on the bottom of the hole. The smaller crystal grain size in the lower region prevents crystals on opposite sides of the cylindrical capacitor from coming into contact with each other and thereby prevents the blockage of the hole (cylinder).

Figure 10:
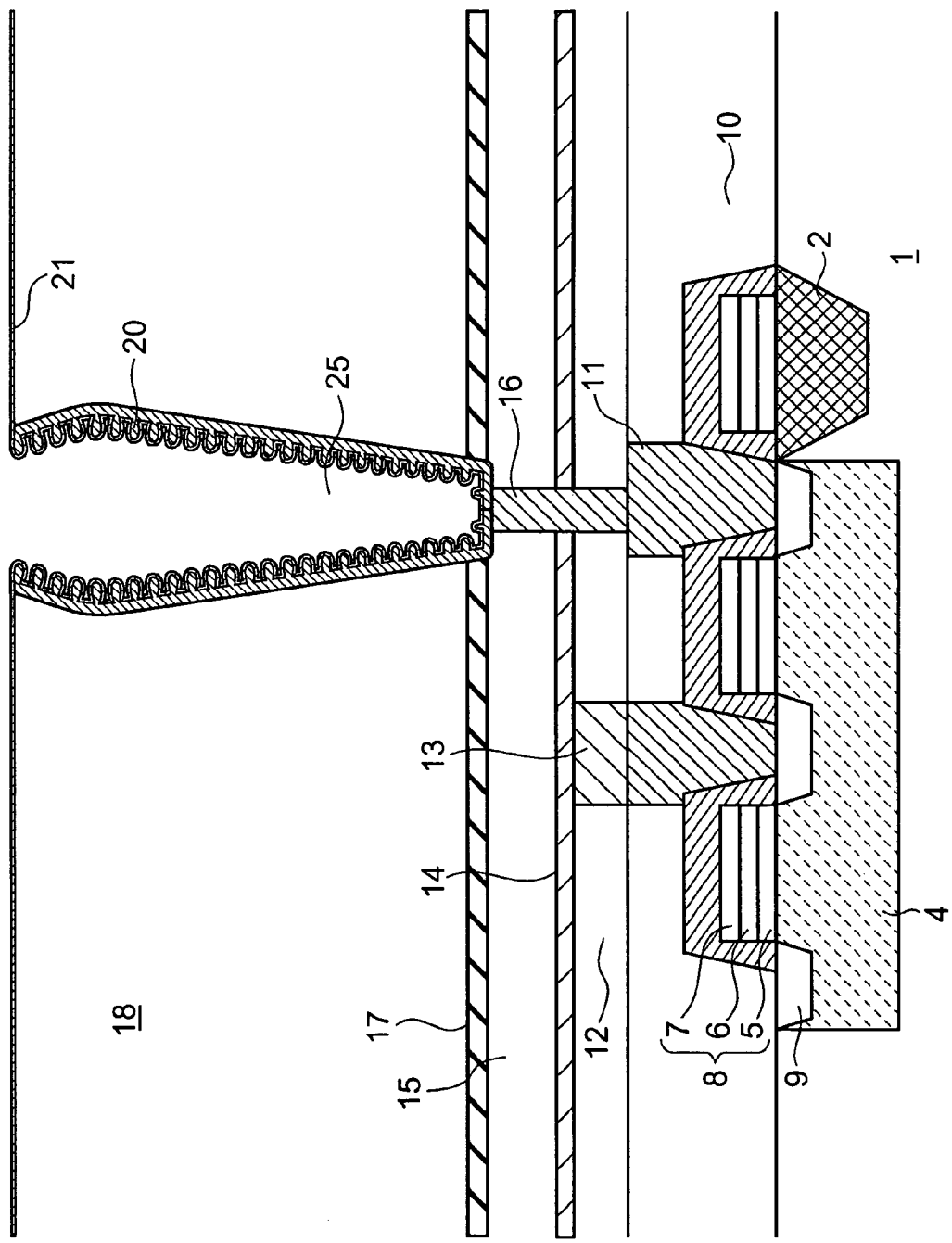
FIG. 10 is a cross-sectional view illustrating the manufacturing method, continued from FIG. 9.

Then, residual silicon on the top surface of the insulating film 18 is removed by CMP or etchback to isolate the lower electrode of the cylindrical capacitor. Then, as illustrated in FIG. 10, a capacitive dielectric film 21 is formed on the lower electrode of the capacitor by chemical vapor deposition (CVD). Since the crystal grain size in the lower region of the cylindrical capacitor is small, the hole (cylinder) has a wider inner space and is therefore sufficiently filled with a deposition gas of the capacitive dielectric film. Thus, the capacitive dielectric film 21 has a uniform thickness.

Figure 11:
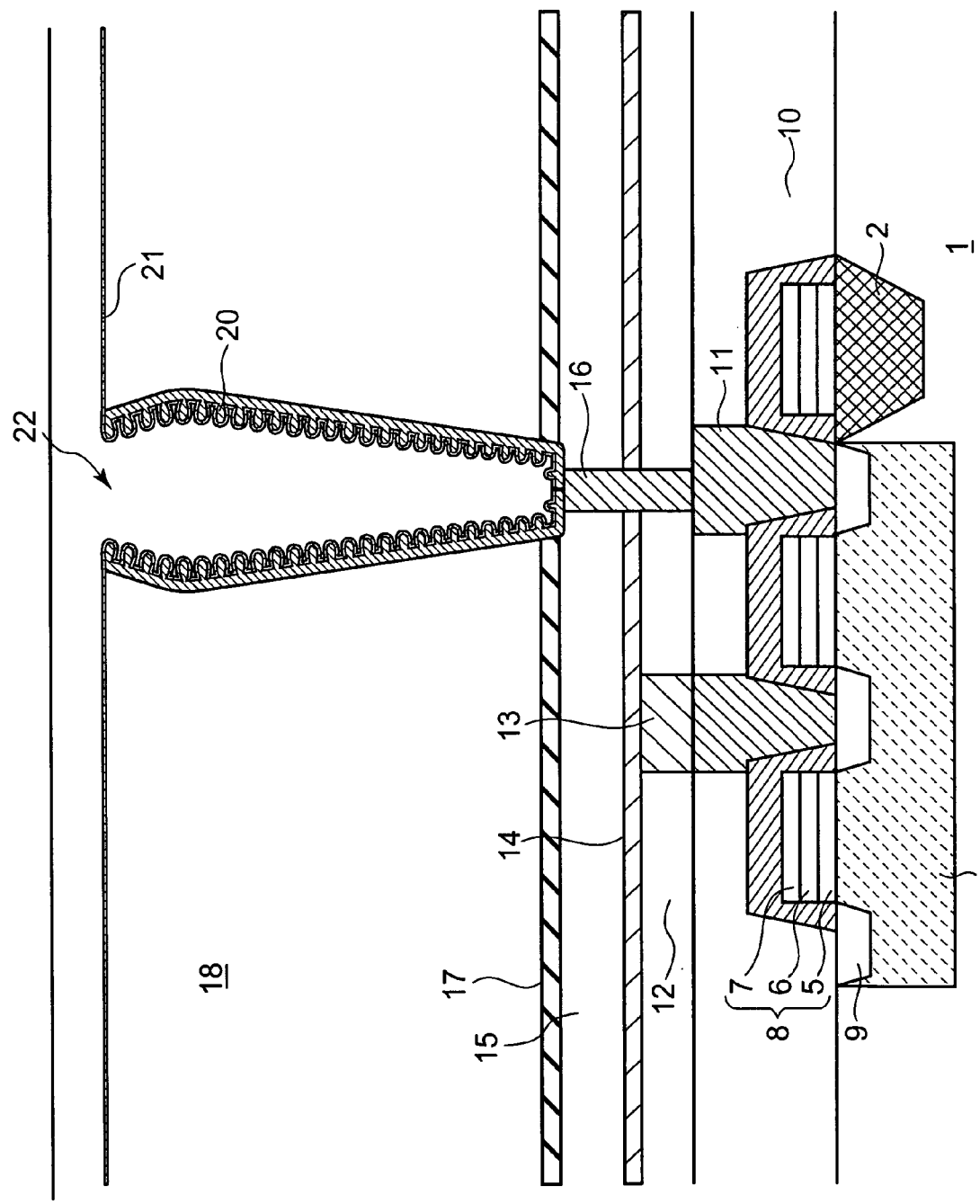
FIG. 11 is a cross-sectional view illustrating the manufacturing method, continued from FIG. 10.

Then, as illustrated in FIG. 11, W/TiN or polysilicon is deposited on the capacitive dielectric film 21 as an upper electrode 22 of the capacitor to form the cylindrical capacitor.

As described above, since the upper low-concentration impurity sublayer on the bottom and the lower region of the cylindrical capacitor is etched away in the present embodiment, the crystal grain size of the resulting HSGs decreases. Thus, HSGs on the opposite wall surfaces in the cylinder do not come into contact with each other or overlap one another. This prevents the blockage of the cylinder. In addition, even when the HSGs come close to each other, the small crystal grain size allows a reactant gas to flow through the HSGs with little obstruction. This prevents poor coverage of the HSGs 20 with the capacitive dielectric film formed by CVD and improves the insulating properties. The capacitive dielectric film without variations in thickness helps to achieve a semiconductor device including a reliable cylindrical capacitor having a large capacitance, and a method for manufacturing the semiconductor device.

[Second Embodiment]

A second embodiment will be described below with reference to FIGS. 12 and 13. The second embodiment is different from the first embodiment in that amorphous silicon serving as the lower electrode of the cylindrical capacitor is isolated before the HSG treatment.

A manufacturing process of from the beginning step to the etching step of amorphous silicon in the second embodiment is the same as that in the first embodiment, as described with reference to FIGS. 2 to 8. Thus, these steps are described briefly. First, as illustrated in FIG. 2, a memory cell transistor 3 is formed on a silicon semiconductor substrate 1. As illustrated in FIG. 3, a first interlayer insulating film 10 is formed and then a polysilicon plug 11 is formed. As illustrated in FIG. 4, a second interlayer insulating film 12 is formed and then a tungsten (W) plug 13 and a bit line 14 are formed. A third interlayer insulating film 15 is formed over the second interlayer insulating film 12 to cover the bit line 14. As illustrated in FIG. 5, a nitride film 17, a fourth interlayer insulating film 18, and an etching mask 24 are formed and then a capacitor hole is patterned.

As illustrated in FIG. 6, a cylindrical capacitor hole 25 is bored in the insulating film 18. Then, as illustrated in FIG. 7, an amorphous silicon layer 19 having a two-layer structure is deposited on the insulating film 18 and on the bottom of the capacitor hole 25. In this embodiment, a lower sublayer 19-1 of the amorphous silicon layer 19 is a high-concentration impurity sublayer and an upper sublayer 19-2 is a low-concentration impurity sublayer. As illustrated in FIG. 8, the amorphous silicon layer 19 is partly etched away by anisotropic etching. These steps are the same as those in the first embodiment.

Figure 12:
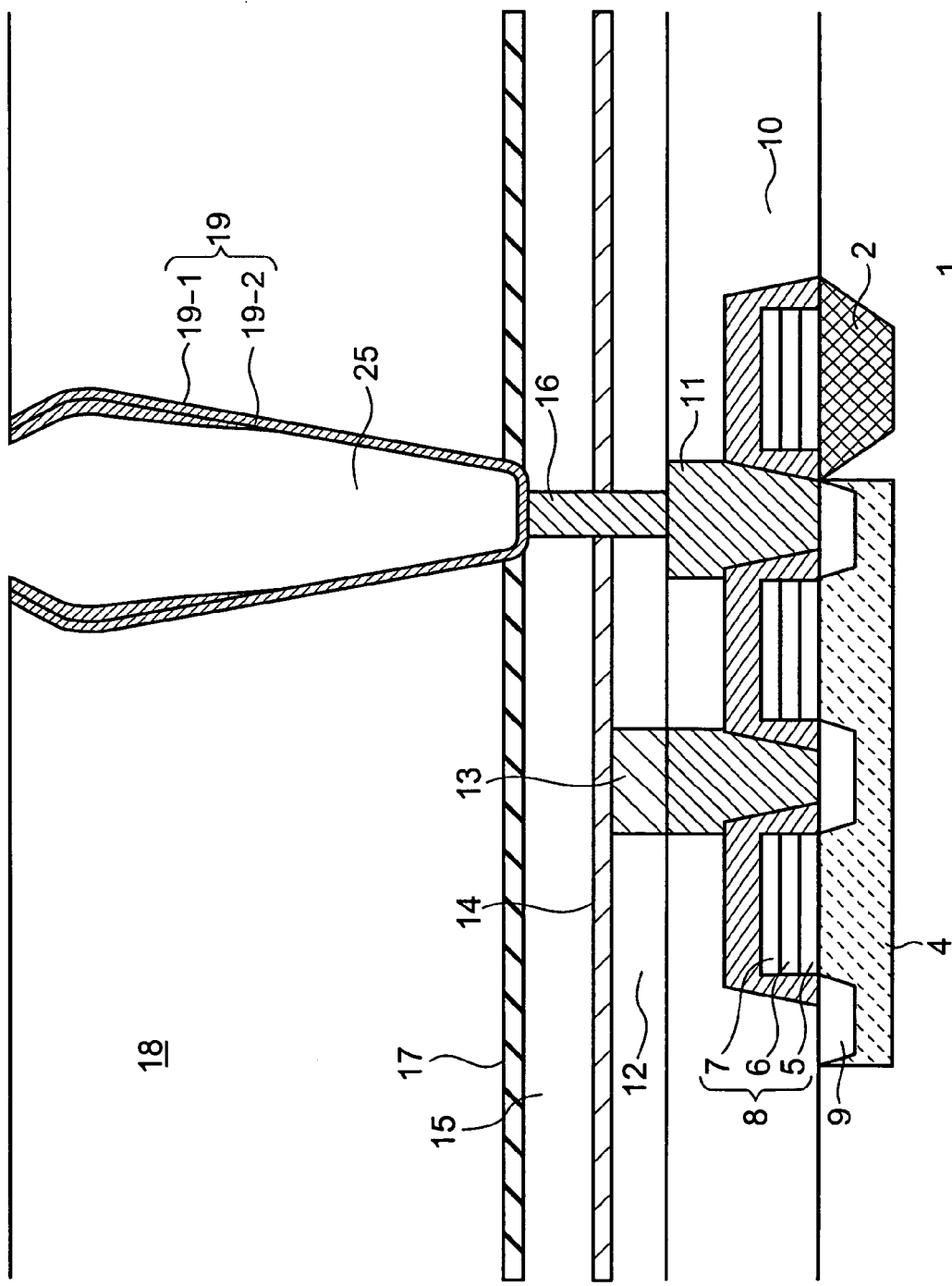
FIG. 12 is a cross-sectional view illustrating a method for manufacturing a semiconductor device according to a second embodiment of the present invention.
Figure 13:
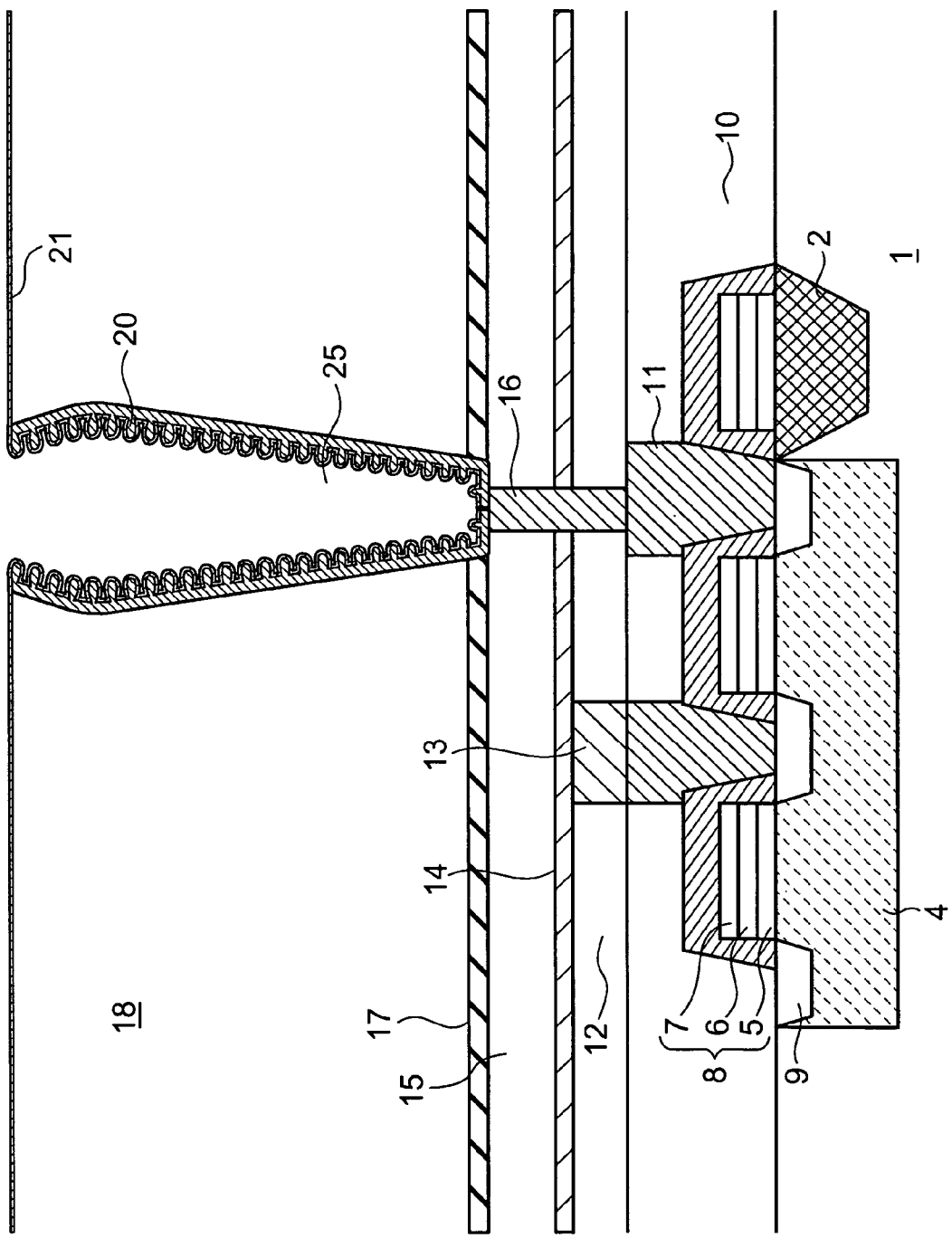
FIG. 13 is a cross-sectional view illustrating the method for manufacturing the semiconductor device according to the second embodiment of the present invention, continued from FIG. 12.

Then, as illustrated in FIG. 12, the amorphous silicon layer 19 on the top surface of the insulating film 18 is removed by CMP or etchback to isolate a lower electrode of the cylindrical capacitor. Then, as illustrated in FIG. 13, HSG is formed by an HSG treatment as described below. First, the amorphous silicon layer 19 is washed to remove a natural oxidation film. Then, microcrystal grains are formed on the surface of the lower electrode with an HSG apparatus using a monosilane or disilane seeding gas at a temperature of 560° C. The microcrystal grains are grown by annealing to form HSGs 20. The upper high-concentration impurity sublayer on the bottom and in the lower region of the hole (cylinder) is entirely or partly etched away. Decreasing the size of the crystal grains on the bottom and in the lower region prevents the crystal grains in opposite regions on the sidewall of the cylindrical capacitor from coming into contact with each other. This prevents the blockage of the cylinder hole.

Then, a capacitive dielectric film 21 is formed on the lower electrode of the capacitor by CVD. Since the crystal grain size of the HSGs is small in the lower region of the cylindrical capacitor, the HSGs in opposite regions on the sidewall do not come close to each other. Thus, a deposition gas of the capacitive dielectric film flows through the HSGs with little obstruction. Thus, the capacitive dielectric film 21 has a uniform thickness. Then, as illustrated in FIG. 11, an upper electrode 22 of the capacitor is deposited on the capacitive dielectric film 21 to form the cylindrical capacitor.

The manufacturing method according to the first embodiment includes the HSG treatment, the isolation of the amorphous silicon layer, and the formation of the capacitive dielectric film in this order. On the other hand, the manufacturing method according to the second embodiment includes the isolation of the amorphous silicon layer, the HSG treatment, and the formation of the capacitive dielectric film in this order. The second embodiment can still achieve the same effects as in the first embodiment.

As described above, in the present embodiment, the etching of the upper low-concentration impurity sublayer on the bottom and in the lower region of the cylindrical capacitor decreases the crystal grain size of the HSGs on the bottom and in the lower region. Thus, the HSGs in opposite regions on the sidewall do not come into contact with each other. This prevents the blockage of the cylinder. In addition, even when the HSGs come close to each other, the small crystal grain size allows a deposition gas of the capacitive dielectric film to flow through the HSGs with little obstruction. This prevents poor coverage of the HSGs with the capacitive dielectric film formed by CVD and improves the insulating properties. The capacitive dielectric film without variations in thickness helps to achieve a semiconductor device including a reliable cylindrical capacitor having a large capacitance, and a method for manufacturing the semiconductor device.

According to the present invention, in a cylindrical capacitor formed in an insulating film, an upper low-concentration impurity sublayer on the bottom and in the lower region of a cylinder is entirely or partly etched away to decrease the crystal grain size of HSGs formed on the bottom and in the lower region. The small crystal grain size of the HSGs prevents grains in opposite regions on the sidewall of the cylinder from coming into contact with each other. This prevents the blockage of the cylinder. In addition, even when the HSGs come close to each other, the small crystal grain size allows a deposition gas of the capacitive dielectric film to flow through the HSGs with little obstruction. Thus, the capacitive dielectric film has a uniform thickness. This improves the insulating properties. The capacitive dielectric film without variations in thickness helps to achieve a semiconductor device including a reliable cylindrical capacitor having a large capacitance, and a method for manufacturing the semiconductor device.

While the present invention is specifically described according to the first and second embodiments, the present invention is not limited to these embodiments and may be modified without departing from the gist of the present invention. For example, while the cylinder according to the present embodiment has a bowing shape, the present invention can also be applied to a cylinder that is a generally right circular cylinder having an opening area defined by lithography in the upper region and a bowl-shaped cylinder having an opening area smaller than that defined by lithography in the lower region of the cylinder.

What is claimed is:

1. A method for manufacturing a semiconductor device including a cylindrical capacitor, comprising the steps of:
   boring a capacitor hole for the cylindrical capacitor;
   forming a silicon layer including a lower high-concentration impurity sublayer and an upper low-concentration impurity sublayer on the wall of the capacitor hole, the lower high-concentration impurity sublayer containing a high concentration of impurities and the upper low-concentration impurity sublayer containing a low concentration of impurities;
   etching the silicon layer;
   and roughening the surface of the silicon layer with a hemispherical silicon grain treatment after etching; wherein
   the upper low-concentration impurity sublayer on the bottom of the capacitor hole is completely etched away and the upper low-concentration impurity sublayer in a lower region of the capacitor hole is partly etched away in the etching step.

2. The method for manufacturing a semiconductor device according to claim 1, wherein the thickness of a residual silicon layer on the bottom of the capacitor hole in the etching step is controlled by monitoring a change in plasma emission generated by the etching of the silicon layer on the top surface of the capacitor hole to determine an etching end point.

3. The method for manufacturing a semiconductor device according to claim 1, wherein the etching rate of silicon on the top surface of the capacitor hole is higher than the etching rate of silicon on the bottom of the capacitor hole in the etching step.

4. The method for manufacturing a semiconductor device according to claim 1, wherein the hemispherical silicon grains on the bottom of the capacitor hole are smaller in crystal grain size than those in an upper region of the capacitor hole in the roughening step.

5. The method for manufacturing a semiconductor device according to claim 1, wherein the silicon layer is etched by anisotropic etching.

6. A semiconductor device including a cylindrical capacitor formed in an insulating film, wherein
the bottom of a cylinder for the cylindrical capacitor has an opening area smaller than that of the top surface of the cylinder,
the cylinder has hemispherical silicon grains on the wall, and
the hemispherical silicon grains on the bottom of the cylinder are smaller in crystal grain size than those in an upper region of the cylinder; wherein
the cylinder has a lower region of an inclined sidewall between the upper region and the bottom, and the hemispherical silicon grains formed in the lower region are smaller in crystal grain size than the hemispherical silicon grains formed in the upper region and are larger in crystal grain size than the hemispherical silicon grains formed on the bottom.

7. The semiconductor device according to claim 6, wherein
a silicon foundation layer is formed on the wall of the cylinder, and
the thickness of the silicon foundation layer on the bottom of the cylinder is smaller than that in the upper region of the cylinder.

8. The semiconductor device according to claim 6, wherein the insulating film comprises a silicon oxide system insulating film made of a material selected from the group of silicon oxide, a boron phosphorous silicate glass, a phosphorous silicate glass, a non-doped silicate glass, a boron silicate glass, a spin-on glass, and silicon oxide nitride and a nitride film.

9. The semiconductor device according to claim 6, comprising the cylindrical capacitor as a memory cell.

10. The semiconductor device according to claim 9, wherein the semiconductor device is a dynamic random access memory.

* * * * *